US011456915B2

(12) United States Patent
Stanciu et al.

(10) Patent No.: US 11,456,915 B2
(45) Date of Patent: Sep. 27, 2022

(54) DEVICE MODEL TEMPLATES

(71) Applicant: MICROSOFT TECHNOLOGY LICENSING, LLC, Redmond, WA (US)

(72) Inventors: Alina Mihaela Stanciu, Redmond, WA (US); Grégory Christopher John Vandenbrouck, Bellevue, WA (US); Hubert Van Hoof, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 119 days.

(21) Appl. No.: 15/985,228

(22) Filed: May 21, 2018

(65) Prior Publication Data

US 2019/0356538 A1 Nov. 21, 2019

(51) Int. Cl.
*H04L 29/08* (2006.01)
*H04L 41/0803* (2022.01)
*H04L 41/08* (2022.01)
*H04L 41/12* (2022.01)
*G06F 30/18* (2020.01)

(52) U.S. Cl.
CPC ...... *H04L 41/0803* (2013.01); *H04L 41/0886* (2013.01); *H04L 41/12* (2013.01); *G06F 30/18* (2020.01)

(58) Field of Classification Search
CPC .. H04L 41/0803; H04L 41/0886; H04L 41/12
See application file for complete search history.

(56) References Cited

U.S. PATENT DOCUMENTS

| | | | |
|---|---|---|---|
| 5,394,035 A | 2/1995 | Elwell | |
| 5,877,766 A | 3/1999 | Bates et al. | |
| 6,023,699 A | 2/2000 | Knoblock et al. | |
| 6,067,093 A | 5/2000 | Grau et al. | |
| 6,298,425 B1 | 10/2001 | Whitaker et al. | |
| 6,732,124 B1 | 5/2004 | Koseki et al. | |
| 7,512,450 B2 | 3/2009 | Ahmed | |
| 7,617,358 B1 | 11/2009 | Liikanen et al. | |
| 7,620,772 B1 | 11/2009 | Liikanen et al. | |

(Continued)

FOREIGN PATENT DOCUMENTS

| | | |
|---|---|---|
| EP | 3570513 A1 | 11/2019 |
| WO | 2011159842 A2 | 12/2011 |

(Continued)

OTHER PUBLICATIONS

"Non Final Office Action Issued in U.S. Appl. No. 15/981,695", dated May 30, 2019, 19 Pages.

(Continued)

*Primary Examiner* — Adnan M Mirza
(74) *Attorney, Agent, or Firm* — Holzer Patel Drennan

(57) ABSTRACT

Configuring a device. A method includes identifying that a device has been connected to a control network. The method further includes, as a result, identifying characteristics of the device, including identifying at least one control or sensor coupled to the device. The method further includes, as a result, identifying an existing configuration template that applies to the device as identified, including identified characteristics. The method further includes configuring the device using the configuration template.

21 Claims, 6 Drawing Sheets

Computing System
*100*

(56) References Cited

U.S. PATENT DOCUMENTS

| | | |
|---|---|---|
| 7,653,847 B1 | 1/2010 | Liikanen et al. |
| 7,685,360 B1 | 3/2010 | Brunnett et al. |
| 7,752,491 B1 | 7/2010 | Liikanen et al. |
| 7,777,632 B2 | 8/2010 | Elwell |
| 7,840,353 B2 | 11/2010 | Ouksel et al. |
| 7,916,421 B1 | 3/2011 | Liikanen et al. |
| 8,635,465 B1 | 1/2014 | Juels et al. |
| 8,732,039 B1 | 5/2014 | Chen et al. |
| 8,743,198 B2 | 6/2014 | Padmanabh et al. |
| 8,797,159 B2 | 8/2014 | Kirkpatrick et al. |
| 8,868,375 B1 | 10/2014 | Christian |
| 9,020,987 B1 | 4/2015 | Nanda et al. |
| 9,361,139 B1 | 6/2016 | Baig |
| 9,361,306 B1 | 6/2016 | Pawar et al. |
| 9,542,396 B1 | 1/2017 | Pawar et al. |
| 9,551,594 B1 | 1/2017 | Stamatakis |
| 9,632,877 B1 | 4/2017 | Yin et al. |
| 9,766,079 B1 | 9/2017 | Poel et al. |
| 9,818,448 B1 | 11/2017 | Sexton et al. |
| 9,852,388 B1 | 12/2017 | Swieter et al. |
| 9,853,827 B1 | 12/2017 | Goodnow et al. |
| 9,875,333 B1 | 1/2018 | Verma et al. |
| 9,882,782 B2 | 1/2018 | Finkler et al. |
| 9,921,726 B1 | 3/2018 | Sculley et al. |
| 9,955,318 B1 | 4/2018 | Scheper et al. |
| 10,027,551 B1 | 7/2018 | Rickards et al. |
| 10,181,139 B2 | 1/2019 | Glass et al. |
| 10,397,733 B2 | 8/2019 | Srinivasan et al. |
| 10,430,293 B1 | 10/2019 | Skowronski et al. |
| 10,437,791 B1 | 10/2019 | Bebchuk et al. |
| 10,484,829 B1 | 11/2019 | Viton et al. |
| 10,691,354 B1 | 6/2020 | Kucherov |
| 10,705,918 B1 | 7/2020 | Hu et al. |
| 2002/0071392 A1 | 6/2002 | Grover et al. |
| 2002/0199017 A1 | 12/2002 | Russell |
| 2004/0003341 A1 | 1/2004 | Alsafadi et al. |
| 2004/0024724 A1 | 2/2004 | Rubin |
| 2004/0054726 A1 | 3/2004 | Doss et al. |
| 2004/0148397 A1 | 7/2004 | Aronoff et al. |
| 2004/0153334 A1 | 8/2004 | Dione |
| 2004/0193635 A1 | 9/2004 | Hsu et al. |
| 2004/0231002 A1 | 11/2004 | Jansen |
| 2004/0267694 A1 | 12/2004 | Sakai et al. |
| 2005/0154494 A1 | 7/2005 | Ahmed |
| 2005/0262081 A1 | 11/2005 | Newman |
| 2005/0278047 A1 | 12/2005 | Ahmed |
| 2006/0015376 A1 | 1/2006 | Sattler et al. |
| 2006/0202834 A1 | 9/2006 | Moriwaki |
| 2006/0248506 A1* | 11/2006 | Luo ............... G06F 8/38 |
| | | 717/104 |
| 2007/0043747 A1 | 2/2007 | Benton et al. |
| 2007/0100872 A1 | 5/2007 | Bodin et al. |
| 2007/0162315 A1 | 7/2007 | Hodges |
| 2007/0168347 A1 | 7/2007 | Childress et al. |
| 2007/0179934 A1 | 8/2007 | Basov et al. |
| 2007/0198708 A1 | 8/2007 | Moriwaki et al. |
| 2007/0282661 A1 | 12/2007 | Franco |
| 2007/0288291 A1 | 12/2007 | Earle |
| 2008/0046445 A1 | 2/2008 | Passey et al. |
| 2008/0183483 A1 | 7/2008 | Hart |
| 2008/0277486 A1 | 11/2008 | Seem et al. |
| 2009/0006143 A1 | 1/2009 | Orttung et al. |
| 2009/0055691 A1 | 2/2009 | Ouksel et al. |
| 2009/0063549 A1 | 3/2009 | Bhatia et al. |
| 2009/0077044 A1 | 3/2009 | Krishnaswamy et al. |
| 2009/0177484 A1 | 7/2009 | Davis et al. |
| 2010/0070618 A1* | 3/2010 | Kim ............... H04W 84/18 |
| | | 709/221 |
| 2010/0134655 A1 | 6/2010 | Kuroiwa |
| 2010/0144383 A1 | 6/2010 | Berger et al. |
| 2010/0228387 A1 | 9/2010 | Bowers et al. |
| 2010/0250551 A1 | 9/2010 | Kamimura et al. |
| 2010/0269158 A1 | 10/2010 | Ehler et al. |
| 2010/0299517 A1 | 11/2010 | Jukic et al. |
| 2010/0318558 A1 | 12/2010 | Boothroyd |
| 2012/0066197 A1 | 3/2012 | Rana et al. |
| 2013/0223279 A1 | 8/2013 | Tinnakornsrisuphap et al. |
| 2013/0262060 A1 | 10/2013 | Higashi |
| 2014/0111520 A1 | 4/2014 | Cline et al. |
| 2014/0112126 A1 | 4/2014 | Claessens et al. |
| 2014/0122428 A1 | 5/2014 | Zhou et al. |
| 2014/0136377 A1 | 5/2014 | Taylor |
| 2014/0219133 A1 | 8/2014 | Dasgupta et al. |
| 2014/0280363 A1 | 9/2014 | Heng et al. |
| 2014/0297206 A1 | 10/2014 | Silverman |
| 2014/0309914 A1 | 10/2014 | Scofield et al. |
| 2014/0310476 A1 | 10/2014 | Kruus et al. |
| 2014/0351181 A1 | 11/2014 | Canoy et al. |
| 2014/0366105 A1 | 12/2014 | Bradley et al. |
| 2015/0032777 A1 | 1/2015 | Dietrich et al. |
| 2015/0067892 A1 | 3/2015 | Zuo et al. |
| 2015/0193739 A1 | 7/2015 | Min et al. |
| 2015/0205582 A1 | 7/2015 | Iskander et al. |
| 2015/0278335 A1 | 10/2015 | Opitz et al. |
| 2015/0294488 A1 | 10/2015 | Iwasaki et al. |
| 2015/0381515 A1 | 12/2015 | Mattson et al. |
| 2016/0004759 A1 | 1/2016 | Ramakrishnan et al. |
| 2016/0012556 A1 | 1/2016 | Moore et al. |
| 2016/0071219 A1 | 3/2016 | Joshi et al. |
| 2016/0072676 A1 | 3/2016 | Gomadam et al. |
| 2016/0072891 A1 | 3/2016 | Joshi et al. |
| 2016/0103931 A1 | 4/2016 | Appavu |
| 2016/0110434 A1 | 4/2016 | Kakaraddi et al. |
| 2016/0135241 A1 | 5/2016 | Gujral et al. |
| 2016/0147962 A1 | 5/2016 | Vollmar et al. |
| 2016/0285717 A1 | 9/2016 | Kim et al. |
| 2016/0291942 A1 | 10/2016 | Hutchison |
| 2016/0292351 A1 | 10/2016 | Jacques et al. |
| 2016/0314542 A1 | 10/2016 | Vollmar et al. |
| 2016/0357524 A1 | 12/2016 | Maluf et al. |
| 2016/0366224 A1 | 12/2016 | Bonagiri et al. |
| 2017/0026806 A1 | 1/2017 | Jampani et al. |
| 2017/0083386 A1 | 3/2017 | Wing et al. |
| 2017/0126681 A1 | 5/2017 | Barrett et al. |
| 2017/0132545 A1 | 5/2017 | Michaely et al. |
| 2017/0168472 A1 | 6/2017 | Ando et al. |
| 2017/0171313 A1 | 6/2017 | Britt et al. |
| 2017/0235813 A1 | 8/2017 | Munro et al. |
| 2017/0242881 A1 | 8/2017 | Northfleet et al. |
| 2017/0244742 A1 | 8/2017 | Helmsen et al. |
| 2017/0247264 A1 | 8/2017 | Eddy |
| 2017/0285081 A1 | 10/2017 | Silverman |
| 2017/0337226 A1 | 11/2017 | Bliss et al. |
| 2017/0351723 A1* | 12/2017 | Vachher ............... G06F 16/258 |
| 2018/0018402 A1 | 1/2018 | Vogler et al. |
| 2018/0039399 A1 | 2/2018 | Kaltegaertner et al. |
| 2018/0060256 A1 | 3/2018 | Walker et al. |
| 2018/0074852 A1 | 3/2018 | Bishop et al. |
| 2018/0096589 A1 | 4/2018 | Lynch et al. |
| 2018/0098191 A1 | 4/2018 | Srinivasan et al. |
| 2018/0116004 A1 | 4/2018 | Britt et al. |
| 2018/0137858 A1 | 5/2018 | Saxena et al. |
| 2018/0189316 A1 | 7/2018 | Mazukabzov et al. |
| 2018/0208448 A1 | 7/2018 | Zimmerman et al. |
| 2018/0268029 A1 | 9/2018 | Clemson |
| 2018/0336396 A1 | 11/2018 | Harrison |
| 2019/0045119 A1 | 2/2019 | Stokking et al. |
| 2019/0095286 A1 | 3/2019 | Fang et al. |
| 2019/0095517 A1 | 3/2019 | Park et al. |
| 2019/0130367 A1 | 5/2019 | Pell et al. |
| 2019/0182369 A1 | 6/2019 | Gauvin et al. |
| 2019/0186924 A1 | 6/2019 | Belt et al. |
| 2019/0289648 A1* | 9/2019 | Kim ............... H04L 41/0803 |
| 2019/0306654 A1 | 10/2019 | Srinivasan et al. |
| 2019/0332437 A1 | 10/2019 | Van hoof et al. |
| 2019/0332693 A1 | 10/2019 | Vandenbrouck et al. |
| 2019/0332713 A1 | 10/2019 | Van Hoof et al. |
| 2019/0332789 A1 | 10/2019 | Vandenbrouck et al. |
| 2019/0335300 A1 | 10/2019 | Viton et al. |
| 2019/0339871 A1 | 11/2019 | Kucherov et al. |
| 2019/0339872 A1 | 11/2019 | Kucherov et al. |
| 2019/0347606 A1 | 11/2019 | Malecha et al. |
| 2019/0354906 A1 | 11/2019 | Stanciu et al. |
| 2019/0354910 A1 | 11/2019 | Escapa et al. |

(56) References Cited

U.S. PATENT DOCUMENTS

| | | |
|---|---|---|
| 2019/0356548 A1 | 11/2019 | Fischer et al. |
| 2019/0356550 A1 | 11/2019 | Stanciu et al. |
| 2020/0042639 A1 | 2/2020 | Mathison et al. |
| 2020/0162847 A1 | 5/2020 | Viton et al. |

FOREIGN PATENT DOCUMENTS

| | | |
|---|---|---|
| WO | 2015160346 A1 | 10/2015 |
| WO | 2016054629 A1 | 4/2016 |
| WO | 2016200656 A1 | 12/2016 |

OTHER PUBLICATIONS

"INT (x86 instruction)", Retreived from: https://en.wikipedia.org/w/index.php?title=INT_(x86_instruction)&oldid=809423342, Nov. 9, 2017, 2 Pages.

"Notice of Allowance Issued in U.S. Appl. No. 15/964,751", dated Jul. 31, 2019, 6 Pages.

"International Search Report and Written Opinion Issued in PCT Patent Application No. PCT/US2019/030779", dated Jul. 10, 2019, 12 Pages.

"International Search Repod & Written Opinion Issued in PCT Application No. PCT/US2019/030797", dated Jul. 8, 2019, 13 Pages.

"Non Final Office Action Issued in U.S. Appl. No. 15/964,751", dated Aug. 29, 2018, 15 Pages.

"Final Office Action Issued in U.S. Appl. No. 15/964,751", dated Feb. 4, 2019, 14 Pages.

"Non Final Office Action Issued in U.S. Appl. No. 15/964,754", dated Feb. 13, 2020, 15 Pages.

"Notice of Allowance Issued in U.S. Appl. No. 15/981,695", dated Jan. 28, 2020, 9 Pages.

"Non Final Office Action Issued in U.S. Appl. No. 15/985,513", dated Mar. 18, 2020, 28 Pages.

"Non Final Office Action Issued in U.S. Appl. No. 16/685,975", dated Mar. 17, 2020, 16 Pages.

"Final Office Action Issued in U.S. Appl. No. 15/964,736", dated Nov. 29, 2019, 12 Pages.

"Final Office Action Issued in U.S. Appl. No. 15/981,695", dated Nov. 8, 2019, 16 Pages.

"International Search Report and Written Opinion Issued in PCT Application No. PCT/US19/030798", dated Jul. 26, 2019, 12 Pages.

"International Search Report and Written Opinion Issued in PCT Application No. PCT/US19/030796", dated Jul. 26, 2019, 10 Pages.

"Non Final Office Action Issued in U.S. Appl. No. 15/985,487", dated Mar. 25, 2020, 39 Pages.

"Non Final Office Action Issued in U.S. Appl. No. 15/964,736", dated Jun. 27, 2019, 12 Pages.

"International Search Report and Written Opinion Issued in Patent Application No. PCT/US2019/026420", dated May 31, 2019, 11 Pages.

"Tag (Metadata)", Retrieved From: https://web archive.org/web/20180128020737/https://en.wikipedia.org/wiki/TAG, Apr. 17, 2018, 10 Pages.

"Final Office Action Issued in U.S. Appl. No. 15/985,487", dated Aug. 26, 2020, 59 Pages.

"Non Final Office Action Issued in U.S. Appl. No. 15/964,626", dated Jul. 24, 2020, 15 Pages.

"Non Final Office Action Issued in U.S. Appl. No. 15/964,623", dated Jul. 24, 2020, 15 Pages.

"Final Office Action Issued in U.S. Appl. No. 15/964,623", dated Jan. 15, 2021, 17 Pages.

"Final Office Action Issued in U.S. Appl. No. 15/964,626", dated Jan. 21, 2021, 17 Pages.

"Non-Final Office Action Issued in U.S. Appl. No. 15/985,513", dated Apr. 19, 2021, 29 Pages.

"Final Office Action Issued In U.S. Appl. No. 15/985,513", dated Aug. 19, 2021, 43 Pages.

Zhan, et al., "The Full Path to Full-Path Indexing", In Proceedings of the 16th USENIX Conference on File and Storage Technologies, Feb. 12, 2018, pp. 123-138.

"Final Office Action Issued in U.S. Appl. No. 15/985,513", dated Jun. 5, 2020, 25 Pages.

"Notice of Allowance Issued in European Patent Application No. 19728785.7", dated May 11, 2022, 7 Pages.

* cited by examiner

DEVICE MODEL TEMPLATES

BACKGROUND

Background and Relevant Art

Computers and computing systems have affected nearly every aspect of modern living. Computers are generally involved in work, recreation, healthcare, transportation, entertainment, household management, etc. A computing system can be manifested through a variety of form factors such as computers, laptops, smartphones, gateways, controllers, IoT devices and sensors.

Further, computing system functionality can be enhanced by a computing systems' ability to be interconnected to other computing systems via network connections. Network connections may include, but are not limited to, connections via wired or wireless Ethernet, wireless mesh networks, cellular connections, or even computer to computer connections through serial, parallel, USB, or other connections via a wide variety of protocols (such as, but not limited to, MQTT, AMQP, http, Bluetooth, OPC-UA, SCADA, CoAP, BACnet, Modbus, KNX, LonTalk, Zigbee, Zwave, Sigfox, LoRa, etc.), some of which are industry or domain specific. The connections allow a computing system to access services at other computing systems and to quickly and efficiently receive data from other computing systems.

As computing systems have become cheaper and smaller, they have begun to proliferate to almost all areas of life. For example, Internet of Things (IoT) devices are network-connected devices that are placed in many physical spaces to enable people to interact with and gather information about their environment. For example, offices or homes may include numerous IoT devices that can be used to control locks, to manage indoor climate and receive climate information, to manage lighting and receive lighting information, to open and close doors, to perform cleaning functions, to control audio and/or video equipment, to provide voice interaction, to provide security and monitoring capabilities, etc. As such, IoT devices can process and generate vast amounts of information. Notably, IoT devices are not limited to use in structures such as offices or homes. For example, IoT devices may be used to track any manner of physical items (including, for example, animals such as livestock or pets), to monitor health of people or animals, and so forth.

Interconnection of computing devices has resulted in the proliferation of IoT networks, including networks of automated control systems where networks of controllers are used to control various devices. The devices are typically connected to controls and sensors. The devices can receive data from the sensors such as environmental data such as temperature, $CO_2$ concentration, airflow, or any one of a number of different environmental conditions. Based on the detected environmental conditions, the devices include computer instructions that can be executed by processors which enable the devices to use the controls to control various pieces of equipment. For example, the controls can be used to control blower motors, heaters, alarms, etc.

One can imagine that even a simple building may include multiple different controllers and/or devices. Each device needs to be properly configured. Such configuration may include information about how to interpret data from sensors, information about how to control equipment, and in particular, information about how to control equipment in view of data received from the sensors. As can be imagined, configuring each device in a control network can be very time-consuming if each device needs to be configured manually.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes a method that may be practiced in an equipment control environment. The method includes acts for configuring a device. The method includes identifying that a device has been connected to a control network. The method further includes, as a result, identifying characteristics of the device, including identifying at least one control or sensor coupled to the device. The method further includes, as a result, identifying an existing configuration template that applies to the device as identified, including identified characteristics. The method further includes configuring the device using the configuration template.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Embodiments illustrated herein are directed to configuring devices in an IoT control network using templates. In particular, a device can be automatically configured based on the characteristics of the device by using a predefined, and previously stored template which can be applied to the device. In particular, when a new device is connected to a control network, the device, including its characteristics, will be identified. This identification allows embodiments to access a template store and match the device characteristics with a template in the template store. A template can thus be identified. The template includes configuration information, such as information about how to interpret data received from sensors, information about how to control controls coupled to the device, and/or information about how to perform various compute operations. These compute operations can be used, for example, to control equipment connected to the device and/or to provide information to other devices in the control network.

Some introductory discussion of a computing system will be described with respect to FIG. 1. Then providing access to sensor data from devices within a physical space, consistent with the multi-database environment introduced above, will be described with respect to FIGS. 2 through 4.

Computing systems are now increasingly taking a wide variety of forms. Computing systems may, for example, be handheld devices, appliances, laptop computers, desktop computers, mainframes, distributed computing systems, datacenters, or even devices that have not conventionally been considered a computing system, such as wearables (e.g., glasses). In this description and in the claims, the term "computing system" is defined broadly as including any device or system (or combination thereof) that includes at least one physical and tangible processor, and a physical and tangible memory capable of having thereon computer-executable instructions that may be executed by a processor. The memory may take any form and may depend on the nature and form of the computing system. A computing system may be distributed over a network environment and may include multiple constituent computing systems.

Figure 1:
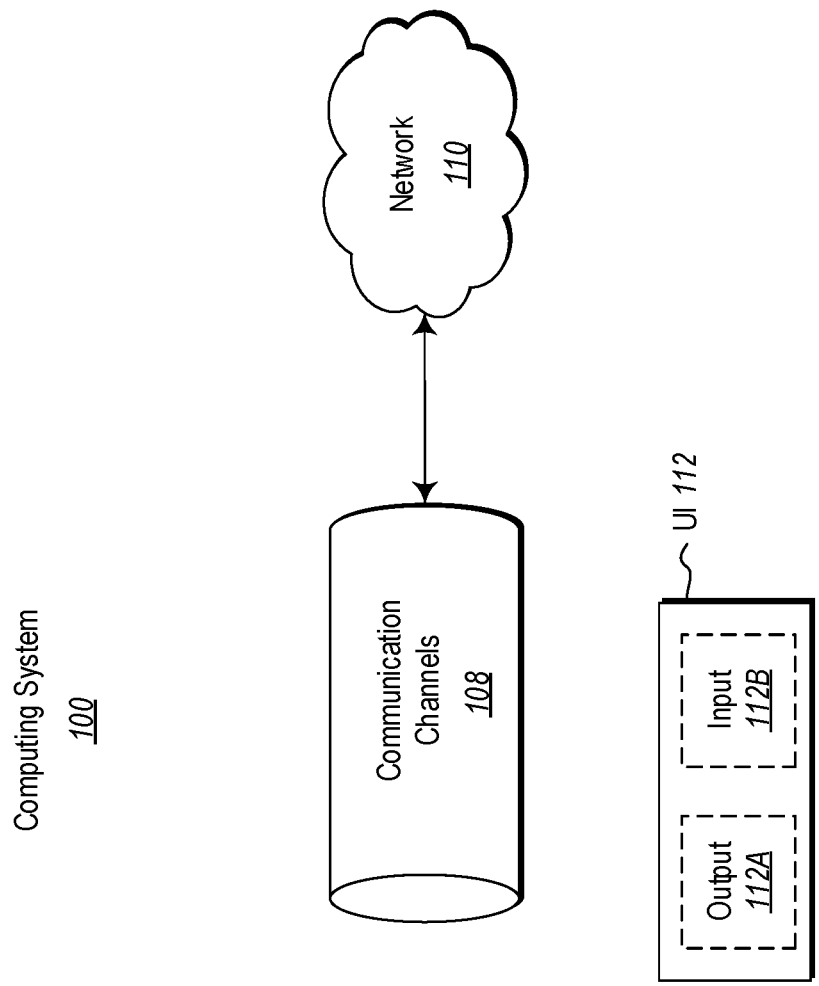
FIG. 1 illustrates an example computer architecture that facilitates operation of the principles described herein.

As illustrated in FIG. 1, in its most basic configuration, a computing system 100 typically includes at least one hardware processing unit 102 and memory 104. The memory 104 may be physical system memory, which may be volatile, non-volatile, or some combination of the two. The term "memory" may also be used herein to refer to non-volatile mass storage such as physical storage media. If the computing system is distributed, the processing, memory and/or storage capability may be distributed as well.

The computing system 100 also has thereon multiple structures often referred to as an "executable component". For instance, the memory 104 of the computing system 100 is illustrated as including executable component 106. The term "executable component" is the name for a structure that is well understood to one of ordinary skill in the art in the field of computing as being a structure that can be software, hardware, or a combination thereof. For instance, when implemented in software, one of ordinary skill in the art would understand that the structure of an executable component may include software objects, routines, methods, and so forth, that may be executed on the computing system, whether such an executable component exists in the heap of a computing system, or whether the executable component exists on computer-readable storage media.

In such a case, one of ordinary skill in the art will recognize that the structure of the executable component exists on a computer-readable medium such that, when interpreted by one or more processors of a computing system (e.g., by a processor thread), the computing system is caused to perform a function. Such structure may be computer-readable directly by the processors (as is the case if the executable component were binary). Alternatively, the structure may be structured to be interpretable and/or compiled (whether in a single stage or in multiple stages) so as to generate such binary that is directly interpretable by the processors. Such an understanding of example structures of an executable component is well within the understanding of one of ordinary skill in the art of computing when using the term "executable component".

The term "executable component" is also well understood by one of ordinary skill as including structures that are implemented exclusively or near-exclusively in hardware, such as within a field programmable gate array (FPGA), an application specific integrated circuit (ASIC), or any other specialized circuit. Accordingly, the term "executable component" is a term for a structure that is well understood by those of ordinary skill in the art of computing, whether implemented in software, hardware, or a combination. In this description, the terms "component", "service", "engine", "module", "control", or the like may also be used. As used in this description and in the case, these terms (whether expressed with or without a modifying clause) are also intended to be synonymous with the term "executable component", and thus also have a structure that is well understood by those of ordinary skill in the art of computing.

In the description that follows, embodiments are described with reference to acts that are performed by one or more computing systems. If such acts are implemented in software, one or more processors (of the associated computing system that performs the act) direct the operation of the computing system in response to having executed computer-executable instructions that constitute an executable component. For example, such computer-executable instructions may be embodied on one or more computer-readable media that form a computer program product. An example of such an operation involves the manipulation of data.

The computer-executable instructions (and the manipulated data) may be stored in the memory 104 of the computing system 100. Computing system 100 may also contain communication channels 108 that allow the computing system 100 to communicate with other computing systems over, for example, network 110.

While not all computing systems require a user interface, in some embodiments, the computing system 100 includes a user interface 112 for use in interfacing with a user. The user interface 112 may include output mechanisms 112A as well as input mechanisms 112B. The principles described herein are not limited to the precise output mechanisms 112A or input mechanisms 112B as such will depend on the nature of the device. However, output mechanisms 112A might include, for instance, speakers, displays, tactile output, holograms and so forth. Examples of input mechanisms 112B might include, for instance, microphones, touchscreens, holograms, cameras, keyboards, mouse of other pointer input, sensors of any type, and so forth.

Embodiments described herein may comprise or utilize a special purpose or general-purpose computing system including computer hardware, such as, for example, one or more processors and system memory, as discussed in greater detail below. Embodiments described herein also include physical and other computer-readable media for carrying or storing computer-executable instructions and/or data structures. Such computer-readable media can be any available media that can be accessed by a general purpose or special purpose computing system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: storage media and transmission media.

Computer-readable storage media includes NAND flash memory or other flash memory, RAM, DRAM, SRAM, ROM, EEPROM, CD-ROM or other optical disk storage, solid-state disk storage, magnetic disk storage or other storage devices, or any other physical and tangible storage medium which can be used to store desired program code means in the form of computer-executable instructions or data structures and which can be accessed by a general purpose or special purpose computing system.

A "network" is defined as one or more data links that enable the transport of electronic data between computing systems and/or modules and/or other electronic devices. When information is transferred or provided over a network or another communications connection (either hardwired, wireless, or a combination of hardwired or wireless) to a computing system, the computing system properly views the connection as a transmission medium. Transmissions media can include a network and/or data links which can be used to carry desired program code means in the form of computer-executable instructions or data structures and which can be accessed by a general purpose or special purpose computing system. Combinations of the above should also be included within the scope of computer-readable media.

Further, upon reaching various computing system components, program code means in the form of computer-executable instructions or data structures can be transferred automatically from transmission media to storage media (or vice versa). For example, computer-executable instructions or data structures received over a network or data link can be buffered in RAM within a network interface module (e.g., a "NIC"), and then eventually transferred to computing system RAM and/or to less volatile storage media at a computing system. Thus, it should be understood that storage media can be included in computing system components that also (or even primarily) utilize transmission media.

Computer-executable instructions comprise, for example, instructions and data which, when executed at a processor, cause a general-purpose computing system, special purpose computing system, or special purpose processing device to perform a certain function or group of functions. Alternatively, or in addition, the computer-executable instructions may configure the computing system to perform a certain function or group of functions. The computer executable instructions may be, for example, binaries or even instructions that undergo some translation (such as compilation) before direct execution by the processors, such as intermediate format instructions such as assembly language, or even source code.

Those skilled in the art will appreciate that the invention may be practiced in network computing environments with many types of computing system configurations, including, traditional computing systems such as smartphones, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, datacenters, wearables (such as glasses, watches, etc.) and the like. In modern computing systems, in the age of Internet of Things (IoT), computing system configurations may be virtually any type of device including (but most certainly not limited to) smart luggage, smart clothing, smart jewelry, smart drinking bottles, smart skate boards, smart golf clubs, smart toys, smart brewing machines, smart wallets, smart home and business automation gear, smart appliances, smart furniture, etc. The invention may also be practiced in distributed system environments where local and remote computing systems, which are linked (either by hardwired data links, wireless data links, or by a combination of hardwired and wireless data links) through a network, both perform tasks. In a distributed system environment, program modules may be located in both local and remote memory storage devices.

Those skilled in the art will also appreciate that the invention may be practiced in a cloud computing environment. Cloud computing environments may be distributed, although this is not required. When distributed, cloud computing environments may be distributed internationally within an organization and/or have components possessed across multiple organizations. In this description and the following claims, "cloud computing" is defined as a model for enabling on-demand network access to a shared pool of configurable computing resources (e.g., networks, servers, storage, applications, and services). The definition of "cloud computing" is not limited to any of the other numerous advantages that can be obtained from such a model when properly deployed.

Reference is made frequently herein to IoT devices. As used herein, an IoT device can include any device that is connected to a network (whether that be a personal area network, local area network, wide area network, and/or the Internet) and that interacts with a physical environment (whether that be to control or influence some aspect of a physical environment, and/or to receive sensor data from a physical environment). As such, references to IoT devices herein should be interpreted broadly to include vast categories of devices, regardless of how those devices may be named or marketed. From a computing perspective, IoT devices may range from fairly complex (e.g., such as being embodied on a general-purpose computer system), to fairly simple (e.g., such as being embodied within a special-purpose microcontroller environment).

Figure 2:
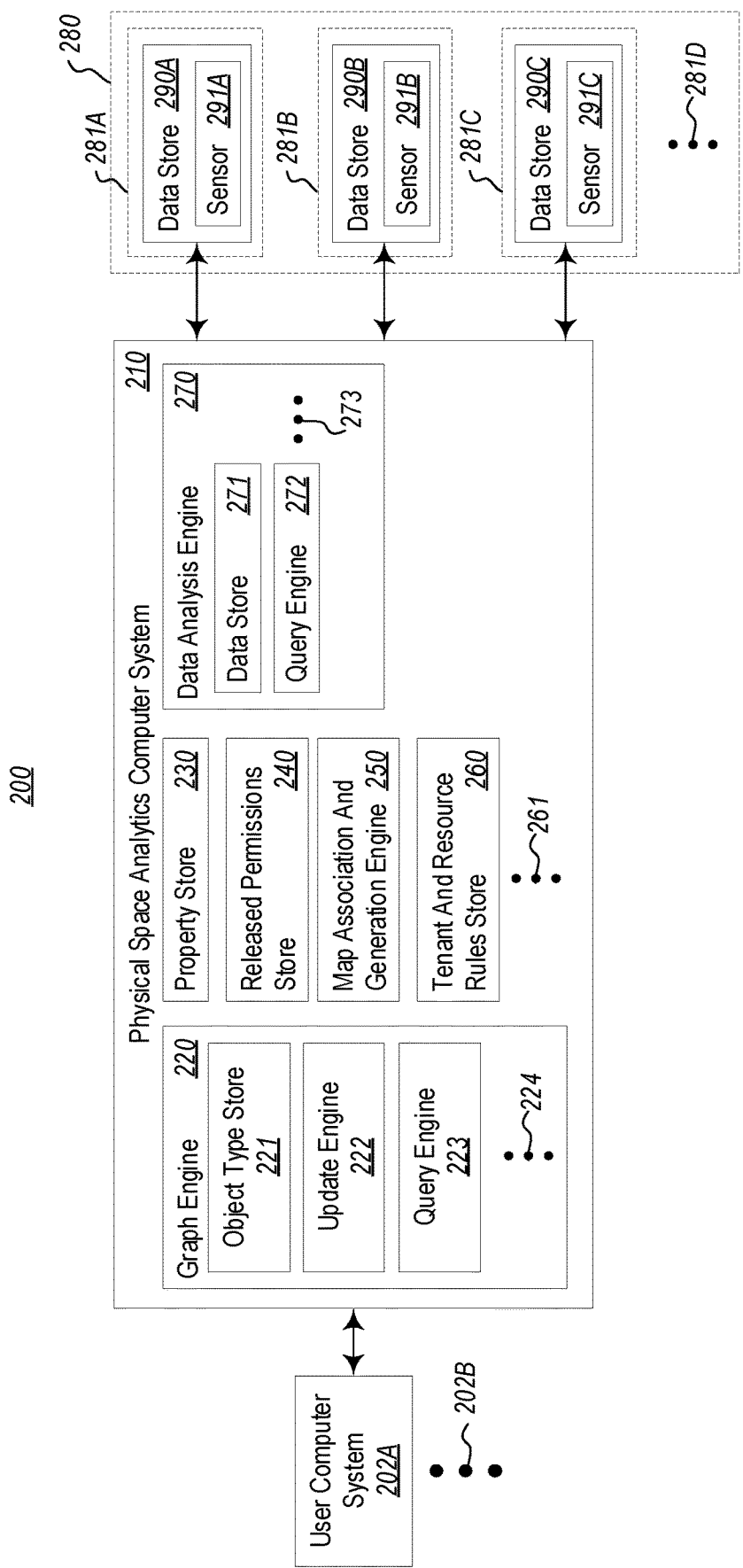
FIG. 2 illustrates an example environment for providing access to sensor data from devices within a physical space.

FIG. 2 illustrates an example environment 200 for providing access to sensor data from devices within a physical space. As illustrated, the environment 200 includes a user computer system 202A. The user computer system 202A may be embodied, for example, by computer system 100, as described with respect to FIG. 1. The user computer system 202A may comprise any type of computer system that is configured to communicate with, and utilize the functionality of, a server computer system 210, which is described later. In an example, the user computer system 202A may comprise a desktop computer, a laptop computer, a tablet, a smartphone, and so forth. Notably, while the environment 200 includes a single user computer system 202A, the ellipses 202B represents that any number of user computer systems may communicate with, and utilize the functionality of, the server computer system 210.

The server computer system 210 is configured to provide access to sensor data from devices (such as IoT devices) located within physical spaces (e.g., a room within a building), as further described herein. Again, the server computer system 210 may be embodied, for example, by computer system 100, as described with respect to FIG. 1. The server computer system 210 may comprise any type of computer system, including any combination of hardware and/or software that is configured to provide access to sensor data from devices located within particular physical spaces.

As shown, the server computer system 210 may include various engines, functional blocks, and components, including (as examples) a graph engine 220, a property store 230, a rules and permissions store 240, an association and generation engine 250, a tenant and resource rules store 260, and a data analysis engine 270, each of which may also include additional engines, functional blocks, and components (e.g., an object type store 221 within the graph engine 220). The various engines, components, and/or functional blocks of the server computer system 210 may be implemented on a single computer system, or may be implemented as a distributed computer system that includes elements resident in a cloud environment, and/or that implement aspects of cloud computing (i.e., at least one of the various illustrated engines may be implemented locally, while at least one other engine may be implemented remotely). In addition, the various engines, functional blocks, and/or components of the server computer system 210 may be implemented as software, hardware, or a combination of software and hardware.

Notably, the configuration of the server computer system 210 illustrated in FIG. 2 is shown only for exemplary purposes. As such, the server computer system 210 may include more or less than the engines, functional blocks, and/or components illustrated in FIG. 2. In particular, the ellipses 261 represent that any number of engines, functional blocks, and/or components may be utilized within the server computer system. Although not illustrated, the various engines of the server computer system 210 may access and/or utilize a processor and memory, such as the processor 102 and the memory 104 of FIG. 1, as needed, to perform their various functions.

Figure 3:
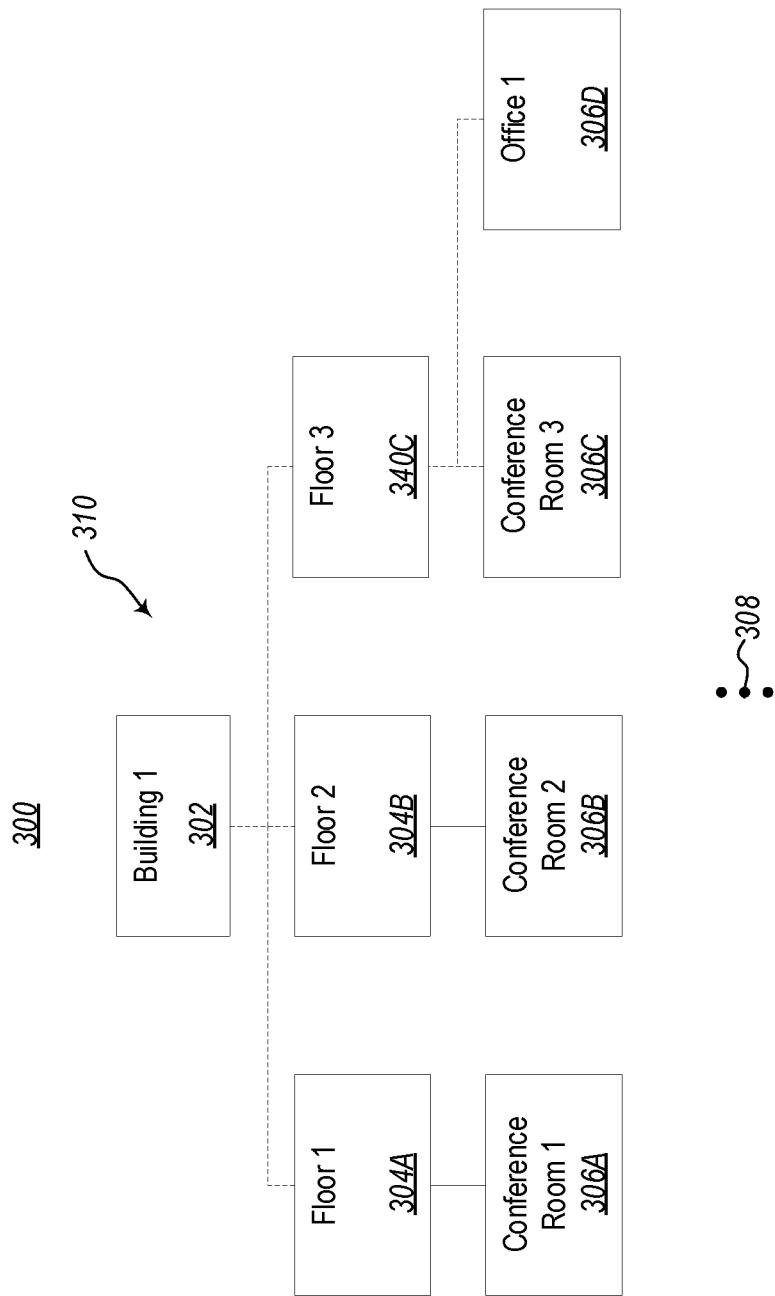
FIG. 3 illustrates an example hierarchical graph associated with a physical space.

As briefly introduced, the server computer system 210 includes the graph engine 220, the property store 230, the rules and permissions store 240, the association and generation engine 250, the tenant and resource rules store 260, and the data analysis engine 270. The graph engine 220 may be configured to generate, store, and/or manage one or more hierarchical graphs (e.g., hierarchical graph 310 of FIG. 3) that defines a topology of areas and sub-areas of a physical space. For instance, FIG. 3 illustrates a hierarchical graph 310 that includes a topology of nodes associated with a physical space comprising "building 1" (e.g., building node 302). The hierarchical graph 310 also represents areas and sub-areas of "building 1," such as different floors (i.e., floor node 304A, floor node 304B, and floor node 304C, all of which are sub-nodes of building node 302), as well as different rooms (i.e., conference room node 306A, conference room node 306B, conference room node 306C, and office node 306D) associated with each floor. Although not shown, each of the room nodes 306A-306A could be associated with additional sub-nodes representing objects in, or associated with, the rooms, such as desks, chairs, tables, computer, lab equipment, services to control the room, services to reserve the room, etc.

Figure 4:
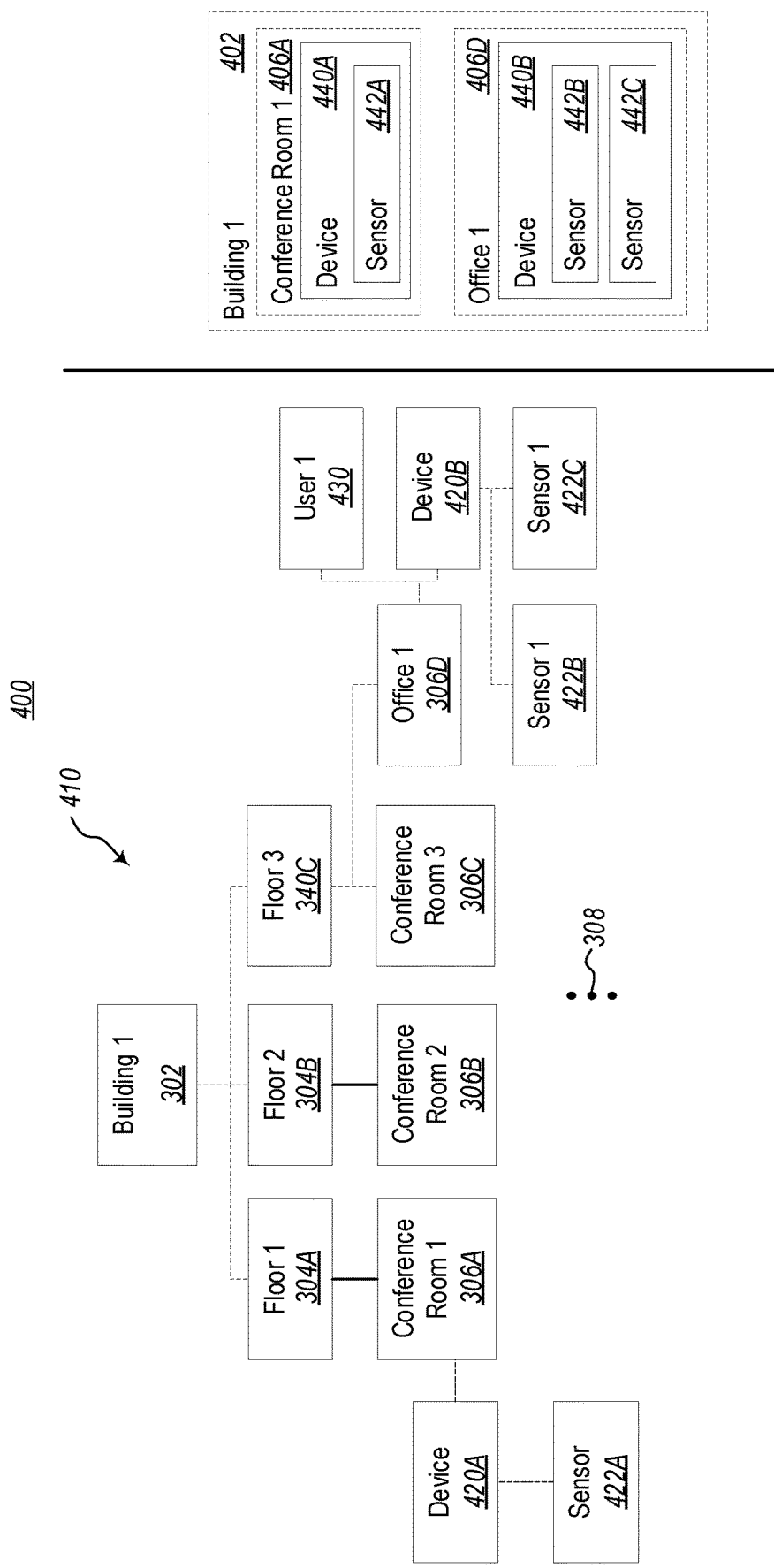
FIG. 4 illustrates an example an example hierarchical graph associated with a physical space and devices associated with areas or sub-areas of the physical space.

Any node in the hierarchical graph 310 could be associated with devices/sensors. For example, the various room nodes (i.e., the conference room node 306A and the office node 306D) may also be associated with devices and sensors. Similarly, FIG. 4 shows a related graph 410, that includes device nodes 420A and 420B and sensor nodes 422A-422C. While only seven nodes associated with areas/sub-areas are illustrated in FIG. 3, the ellipses 308 represents that any number of nodes that are associated with areas/sub-areas and devices/sensors may be utilized when practicing the principles described herein (whether those nodes be added or deleted in a horizontal direction (breadth) or a vertical direction (depth)). Furthermore, the topology of the graph may be continuously modified via adding or deleting nodes of the graph (in a horizontal direction or vertical direction). For instance, using the example of FIG. 3, a number of additional building nodes associated with different buildings than building 1 (corresponding to building node 302), each of which additional buildings may include additional nodes corresponding to floors, rooms, and so forth, may also be included within the graph 310.

In some embodiments, the hierarchical graph 310 may be stored within a relational database, though any type of database could be used. Additionally, regardless of the type of graph used, the full paths in the graph for each given node may be stored as metadata in the node to increase the performance and efficiency of querying the hierarchical graph 310. In this way, identification (e.g., via a query) of any ancestral node or child node (i.e., children nodes, grandchildren nodes, great-grandchildren nodes, and so on) of a given node may be performed in an order of one operation (i.e., an O(1) operation). For instance, a query that requests each node having a path that starts with "building1/floor3" (i.e., corresponding to the floor node 304C) may identify conference room 3 and office 1 (i.e., corresponding to conference room node 306C and office node 306D, respectively) as being children of the floor node 304C in an O(1) operation.

Notably, even if the conference room node 306C and the office node 306D were grandchildren, great-grandchildren, and so on, of the floor node 304C, a request for identification of each node having a path that starts with "building1/floor3" could result in identification of the conference room node 306C and the office node 306D (as well as any nodes between the floor node 304C and the conference room node 306C/the office node 306D) in an O(1) operation. Accordingly, paths associated with each node may be automatically computed and saved, which effectively tracks a primary identification for each node of the graph. While a cost is incurred upfront to generate and store each path (e.g., in connection with the addition and/or removal of one or more nodes to within the graph), the graph may be quickly and efficiently traversed to identify nodes and relationships between nodes within the graph than traditional traversing of graphs. By storing primarily static information in the graph, however, the need to generate/store these paths can be relatively infrequent.

Returning to FIG. 2, as illustrated, the graph engine 220 includes various components that may comprise any combination of appropriate hardware and/or software, including an object type store 221, an update engine 222, and a query engine 223. Notably, the ellipses 224 represents that any number of components may be included with the graph engine 220 (i.e., more or less than the components illustrated within the graph engine 220).

The object type store 221 comprises a data store of node object types that can be selected to create additional nodes within the graph 310. For instance, in addition to the node object types of buildings, floors, and rooms that are explicitly shown in FIG. 3, any number of object types associated with areas/sub-areas of physical spaces (as well as devices/sensors and individuals, as further described herein) may be used within the graph 310, including but not limited to organizations (e.g., businesses), geographic regions (e.g., continents, countries, states, cities, counties, and so forth), types of areas (e.g., buildings, farms, houses, apartments, conference rooms, offices, bathrooms, breakrooms, study areas, desks, chairs, and so forth), types of devices (e.g., thermostat, projector, paper towel dispenser, television, computer, and so forth), types of sensors (e.g., thermocouple, thermistor, humidity sensor, $CO_2$ sensor, Geiger counter), and so forth. Additionally, the object type store 221 may be extensible, such that additional object types may be created on demand.

The update engine 222 may be configured to update the hierarchical graph 310 with any changes made to the graph. For instance, the update engine 222 may update the graph with additional nodes, update the graph with less nodes (e.g., deleted nodes), update nodes with new or modified properties, update nodes with new or modified paths, and perform any other operations associated with modifying or updating the graph.

The query engine 223 may be configured to allow for performing queries to the hierarchical graph 310. In particular, the query engine 223 may be configured to receive queries, generate query plans, build responses to queries, and/or perform any other operations associated with receiving and responding to queries of the hierarchical graph 310.

As briefly introduced, the server computer system 210 further includes data analysis engine 270. The data analysis engine 270 may be configured to receive, gather, manage, and process data received from devices/sensors located within a physical space (associated with the hierarchical graph that defines the topology of the physical space). For instance, FIG. 2 illustrates various devices and sensors located within a physical space 280. In particular, the physical space 280 comprises various areas and sub-areas, including area/sub-area 281A, area/sub-area 281B, and area/sub-area 281C. Each of the sub-areas includes a single device having a single sensor (i.e., area/sub-area 281A includes device 290A having sensor 291A, area/sub-area 281B includes device 290B having sensor 291B, and area/sub-area 281C includes device 290C having sensor 291C). Notably, while each of the areas/sub-areas within the physical space 280 includes a single device having a single sensor, the ellipses 290 represents that there may be any number of areas/sub-areas within the physical space 280, each of the areas/sub-areas including any number of devices having any number of sensors (including zero devices/sensors).

Notably, the devices and sensors may include any type of devices/sensors, including but not limited to devices/sensors associated with detecting temperature, $CO_2$, light, pressure, toxic chemicals, humidity, and so forth. As such, the combination of the devices 290 (i.e., the device 290A through the device 290C) and the sensors 291 (i.e., the sensor 291A through the sensor 291C) may be configured to capture sensor data (e.g., changes in temperature) and send the captured data to the data analysis engine 270. Furthermore, "sensors" can be partially or entirely virtual. A sensor, as used herein, does not have to be a physical device, but rather a "sensor" output could be a value provided by another cloud service or API. For example, a "sensor" could output the current weather forecast for a building's location from NOAA.

The data analysis engine 270 may then be configured to receive, gather, manage, and process data received from such devices/sensors. In particular, as illustrated, the data analysis may include a data store 271 that is configured to organize, store, and allow access to received sensor data. The data store 271 may comprise any type of data store that is configured to manage dynamic, frequently changing data such as sensor data, and that provides quick and efficient performance. In an example, the data store 271 may comprise a key-value database. For instance, the data store 271 may comprise a distributed, in-memory key-value store. Data associated with a particular device (e.g., sensor data) may also be linked with device nodes of the hierarchical graph (e.g., the hierarchical graph 410), such that upon identification of a device node within the hierarchical graph, sensor data associated with the device corresponding to the device node may also be accessed, as further described herein.

As shown, the data analysis engine 270 further includes a query engine 272. The query engine 272 may be configured to allow for performing queries to the data store 271. In particular, the query engine 272 may be configured to receive queries, generate query plans, build responses to queries, and/or perform any other operations associated with receiving and responding to queries of the data store 271.

FIG. 4 illustrates an environment 400 including hierarchical graph 410 comprising area/sub-area nodes, as well as device/sensor nodes that are each associated with one or more area/sub-area nodes. As shown, the conference room node 306A is associated with device node 420A (having a corresponding sensor node 422A) and the office node 306D is associated with the device node 420B (having two corresponding sensor nodes, the sensor node 422B and the sensor node 422C). Additionally, FIG. 4 includes a representation of an actual physical space 402 (associated with building 1) that corresponds to the building node 302.

As illustrated, the physical space 402 also comprises conference room 406A (associated with conference room 1 and corresponding to the conference room node 306A) that includes the actual physical device 440A having the sensor 442A, as well as office 406D (associated with office 1 and corresponding to the office node 306D) that includes the actual physical device 440B having both the sensor 442B and the sensor 442C. In a specific example, the device 440A may correspond to a thermostat that includes a thermocouple (i.e., the sensor 442A) for measuring temperature. Such temperature measurements may then be sent to the data analysis engine for managing, storing, and processing the received sensor data.

Additionally, as illustrated in FIG. 4, user nodes (e.g., user node 430) may be included within the hierarchical graph 410 as being associated with one or more area/sub-area nodes. In particular, FIG. 4 shows the user node 430 being associated with the office node 306D. In a specific example, the user 1 (i.e., corresponding to the user node 330) may comprise an individual that has been assigned to office 1 (i.e., corresponding to the office node 306D).

Notably, regardless of object/node type (e.g., area/sub-area nodes, device nodes, sensor nodes, user nodes), data and/or metadata associated with the node may be stored in the hierarchical graph (e.g., the hierarchical graph 310 or the hierarchical graph 410), the data store 271 of the data analysis engine 270, or any other appropriate location associated with the server computer system 210.

As briefly introduced, the server computer system 210 further includes property store 230, rules and permissions store 240, association and generation engine 250, and tenant and resource store 260. The property store 230 may comprise a data store that includes properties associated with nodes of the hierarchical graph 310. For instance, particular properties may automatically be associated with particular object types (i.e., node types), as well as children of such object types. In a more particular example, a property associated with occupancy of a chair within a room may propagate to the room itself (i.e., showing that the room is occupied). Furthermore, as discussed with respect to the object type store 231, the property store may also be extensible, such that properties may be created and associated with any given node, and potentially associated with ancestral or children nodes of the given node.

The rules and permissions store 240 may include various rules and permissions associated with particular roles assigned to users. For instance, based on a particular role (e.g., an administrator) assigned to a user, the user may have access to perform various operations, including adding/deleting nodes, modifying nodes, accessing/modifying functionality of various devices (e.g., locking doors), and so forth.

The association and generation engine 250 may be configured to perform numerous functions with respect to associating maps with the hierarchical graph (and devices providing data to the data store), and/or generating the hierarchical graph, itself. For instance, the association and generation engine 250 may be able to generate the hierarchal graph 300 based on user input and/or based on a map. In another example, the association and generation engine 250 may be able to link nodes of the hierarchical graph to locations or devices included within a map. In yet another example, the association and generation engine 250 may further be able to generate a map based on information included within the hierarchical graph corresponding to nodes of the hierarchical graph.

The tenant and resource rules store 260 may include rules associated with how resources, permissions, properties, and so forth are to be handled for each given entity (e.g., tenant) that utilizes the hierarchical graph.

Notably, the ellipses 261 represent that the server computer system 210 may include any number of components (i.e., whether more or less) than the components illustrated within the server computer system in FIG. 2. For instance, while both the graph engine 220 and the data analysis engine 270 include corresponding query engines (i.e., the query engine 223 and the query engine 272, respectively), an overarching query engine may be included within the physical analytics computer system that allows for querying both the graph engine 220 and the data analysis engine 270. In this way, a user may be able to generate queries that can traverse the hierarchical graph (e.g., the hierarchical graph 410) to identify one or more devices associated with a particular area/sub-area of the hierarchical graph, as well as current (or previous) sensor data associated with the one or more devices via the data store 271 and the data analysis engine 270.

Figure 5:
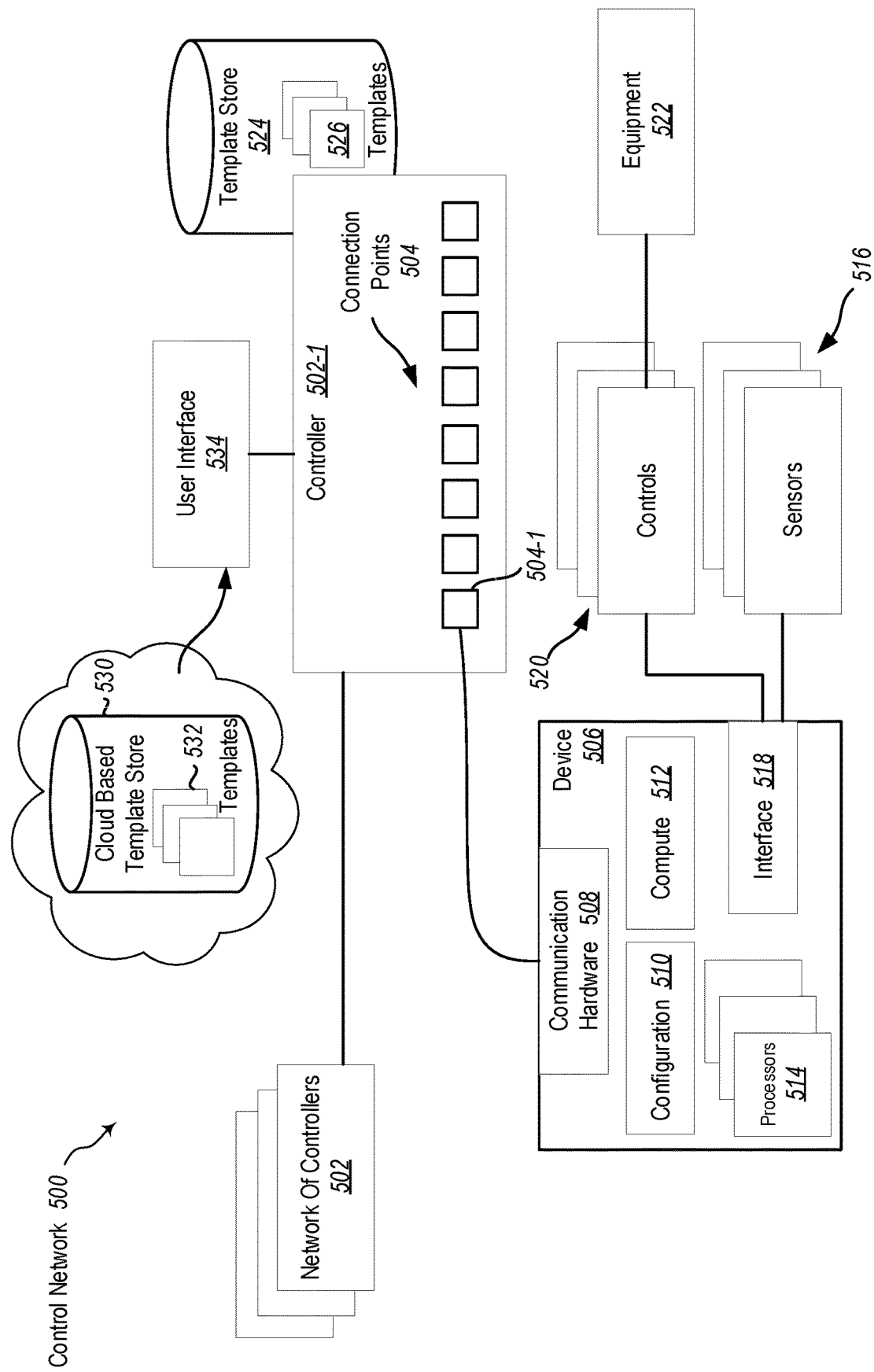
FIG. 5 illustrates an example control network.

Referring now to FIG. 5, an example is illustrated. FIG. 5 illustrates an example control network 500. The control network 500 includes a network of controllers 502. For purposes of the examples illustrated herein, attention is directed to a particular controller, namely controller 502-1.

As illustrated in FIG. 5, controller 502-1 includes a plurality of connection points 504. FIG. 5 illustrates that a device 506 is connected to a particular connection point 504-1.

The device 506 may be any one of a number of different devices available from various manufacturers in various different model numbers, including various different capabilities and characteristics. For example, the device 506 may be a programmable logic controller or other smart building control device. The device 506 includes communication hardware to connect to the connection point 504-1. The communication hardware may be for example hardware configured to communicate using a particular protocol for communicating with the controller 502-1. For example, the communication hardware 508 may be a BACnet communication device configured to use the BAC net communication protocol.

The device 506 further includes configuration 510. The configuration 510 comprises data to configure the device 506. The configuration 510 may include various pieces of information. For example, the configuration 510 may include identification information including an identifier for the device in the control network 500. Alternatively or additionally, the configuration 510 may include a description of the device 506. Alternatively or additionally, the configuration 510 may include an enumeration of inputs and outputs into the device 506. Alternatively or additionally, the configuration 510 may include information about controls and/or sensors coupled to inputs and outputs of the device 506.

The configuration 510 typically includes compute 512. Note that the configuration 510 is typically stored in some type of nonvolatile storage on the device 506. For example, the configuration 510 may be stored in NAND flash memory on the device 506. The compute 512 includes computer executable instructions configured to be executed by processors 514. The computer executable instructions can include a multitude of various different functions. For example, the compute 512 may include instructions that when executed by the processors 514, format information received from the sensors 516 to a form that is readable and/or understandable by another device or human operator. For example, consider a sensor such as a temperature sensor. Typically, a temperature sensor will output a voltage that corresponds with a temperature. However, one will typically not be able to ascertain the corresponding temperature without some conversion performed on the voltage to produce a correlating temperature. Thus, the compute 512 can include instructions that allow the device 506 to obtain the voltage from the sensors 516 through an interface 518. The compute 512 can then perform algorithmic actions on the identified voltage to convert the voltage to an appropriate temperature value. This temperature value can be provided to the controller 502-1 or to other elements in the control network 500 which can use the temperature value for various appropriate purposes.

Note that in many embodiments, the compute 512 will include computer executable instructions that configure the processors 514 to use the information from the sensors to control the controls 520. For example, the compute 512 may include instructions that use temperature values to cause heaters and blowers to be turned on and off.

The following illustrates various examples of what the compute can be configured to perform. The compute 512 can configure processors 514 to interpret sensor data. Alternatively or additionally, the compute 512 can configure the processors 514 to use sensor data to control equipment 522 using the controls 520. For example, the compute 512 can configure the processors 514 to cause equipment such as blowers to be actuated or deactivated, heaters to be activated or deactivated, alarms to be activated or deactivated, and so forth.

As noted above, the compute 512 can configure the processors 514 to provide notifications to other elements of the control network 500 through the controller 502-1 or through other means. For example, in some embodiments, the equipment 522 may include communication hardware configured to communicate information to various entities. For example, the communication hardware could be a telephone providing an automated telephone response, and SMS transmitter configured to provide an automated text response, an email server configured to provide an automated email response, an audible alarm configured to provide an audible notification, a notification publisher configured to publish notifications to subscribers of the publisher, an HTTP message server configured to send automated notifications to preconfigured endpoints, or virtually any other communication equipment.

Other examples of equipment may include blower motors, heaters, chillers, actuators, robotic equipment, power transfer equipment, power generation devices, switches, circuit breakers, relay devices, or other equipment. The sensors 516 may include various devices such as temperature sensors, $CO_2$ detectors, fire detectors, smoke detectors, airflow detectors, presence detectors for detection of human or other occupants, sensors coupled to scheduling systems to identify schedules of rooms or other spaces, sensors coupled to computing systems having historical information about a space, or virtually any other data input source.

As discussed above, adding the configuration 510 to a device 506 could be a complex and time-consuming process if multiple devices need to be configured in multiple different ways, or even the same way individually. Thus, embodiments herein are able to obtain templates from a template store and automatically apply the configuration 510 on the device 506. For example, FIG. 5 illustrates a template store 524. The template store 524 includes a set of templates 526. The templates include information that can be used to configure a device 506. Such as the device 506.

The following now illustrates an example of a device model template.

Device model template
  Name
  Template Id
  Description
  Connection State, Health State
  Model, types and subtypes that this template applies to (Rpi3, etc.)
  Available sensor types, data types, data subtypes, units.
  Custom extended properties (device generated or cloud desired properties)
  Transform computes
    Input
    Matchers
    Output
    Actions
    Type of payload (encrypted)

In the example illustrated above, the device model template includes a name. The name may be for example a descriptive name that includes hints as to the device type, the device manufacturer, the device model number, or other useful information.

In the example illustrated above, the device template may include a template ID. The template ID may include a unique GUIDt or other identifier that can be used to uniquely identify the device template.

In the example illustrated above, the device template may include a description. The description may include prose text that identifies what type of device the device template should be used for, and other useful information that a user can examine to determine characteristics of the device template.

In the example illustrated above, the device model template includes connection State and/or health State.

In the example illustrated above, the device model template includes model information. The model information may define types and subtypes that a given template applies to. For example, in some embodiments, the model may include a model number, manufacture, and other useful information that can be used to readily identify a device corresponding to the device model template.

In the example illustrated above, the device model template includes available sensor types, data types, data subtypes, and units. This information may define the types of sensors that can be used with the particular device model template, the data types and data subtypes that can be used with the device model template, and what kind of SI units can be used with the device model template.

In the example illustrated above, the device model template may further include fields for custom extended properties. These could be device generated properties or properties from a cloud service, or from some other appropriate location.

As illustrated previously herein, the device model templates may include compute 512. In the example illustrated above, one example of compute includes transform compute which may define input variables, matchers, output variables, actions to be performed, types of payload, etc. In some embodiments, the transform computes may include information about how to encrypt payload data. For example, in some embodiments the transform computes may include appropriate credentials such as keys, tokens, or other items that can be used to encrypt data produced by the device 506 and sent by the device 506.

Device model templates are able to be shared across users and devices. Embodiments may include a library of templates.

Illustrating now a functional example, a control network administrator may desire to connect a device such as the device 506 to the control network 500 by connecting the device 506 to the controller 502-1. To accomplish this, the network administrator uses various wired and/or wireless connections to connect the communication hardware 508 through the connection .504-1 of the controller 502-1. When the controller 502-1 detects the device 506 has been connected to the controller 502-1, the controller will attempt to obtain a template to automatically configure the device 506.

First, the controller 502-1 will attempt to identify characteristics of the device 506. In the most basic scenario, the controller 502-1 will attempt to identify a manufacturer and model number of the device 506. In some embodiments, simply identifying the device manufacturer and model number allows the controller 502-1 to find a template from the template store 524. The controller can then obtain the appropriate template and apply the template to the device 506. Applying the template to the device 506 causes the configuration 510 to be applied to memory and/or storage of the device 506. This allows the device to be properly configured to interact with sensors 516, controllers 520, and ultimately the equipment 522. Simply by applying the template, the device 506 is configured to perform various compute actions as illustrated above.

In other embodiments characteristics of the device 506 may be identified in other ways. For example, in some embodiments the controller will attempt to do identify sensors and/or controls connected to the device 506. For example, if the controller identifies temperature sensors and heater controls on the device 506, then the controller can identify characteristics about the device 506 that can be matched to templates in the templates 526 such that an appropriate template can be obtained to configure the device 506. In particular, there may be a template in the templates 526 for a device 506 that acts as a temperature controller.

In an alternative or additional embodiment, the controller may be able to identify a location of the device 506 in a topology of devices. FIGS. 1 through 4 illustrate another a number of examples of a topology of devices and controllers. Suffice it to say at this point, the location of a device within it apology may be used to match the device 506 to a template in the set of templates 526. Again, as illustrated above, once an appropriate template has been identified by the controller 502-1 the template can be applied to the device to automatically configure the device 506 including configuring the compute 512.

In an alternative or additional example, the controller 502-1 may be able to identify characteristics of the device 506 based on information that can be obtained by pinging the device 506. For example, the controller may be able to identify the number of processors 514 available on the device, the amount of memory available on the device 506, the type the types of interfaces 518 on the device 506, or other information about the physical characteristics of the device 506. This information may be used to identify a template from among the templates 526 that can be applied to the device 506 to automatically configure the device 506 to function in the control network 500.

Illustrating a somewhat more complex example, the controller 502-1 may be configured to send certain communication information to the device 506 and to sense what communication is returned from the device 506. The controller can then attempt to deduce characteristics of the device 506. For example, the controller 502-1 may send a message to the device 506 asking for a raw data value from a specific interface of the device 506. Based on the raw data value, the controller may identify a number of possible sensors that produce such raw data values. For example, in one embodiment, the controller 502-1 may know that the device 506 and/or sensors 516 of the device 506 are installed in a particular environment having particular characteristics, such as temperature, $CO_2$ levels, airflow, etc. If the controller 502-1 receives information about raw data indicating that that is typical of raw data produced by a temperature sensor, then the controller 502-1 can make an initial assumption that the device 506 is a temperature controller. The controller 502-1 can perform various actions to confirm this functionality such as by sending a command to the device 506 indicating that a control connected to the interface 518 should actuate a heater. If the device 506 response and actuates a heater, then the controller 502-1 has additional information indicating that the device 506 is a temperature controller. This increases the confidence of the controller 502-1 that the device 506 is a temperature controller. Once the controller 502-1 has identified the device 506 is a temperature controller, then the controller 502-1 can obtain a template from the set of templates 526 for a temperature controller which can be automatically applied to the device 506 such that the device 506 is configured as a temperature controller.

Note that embodiments may be able to identify other types of sensors and controls on the device 506, and may be able to perform various actions to confirm the characteristics of the device 506.

The running example to this point has illustrated an example where the template store 524 is accessible to the controller 502-1 by being part of the controller 502-1 or in close proximity to the controller 502-1. However, it should be appreciated that the controller 502-1 can obtain device templates from other locations as well. For example, FIG. 5 illustrates a cloud environment 528 storing a cloud-based template store 130 having templates 132. In some embodiments, the controller 502-1 may be coupled to a user interface 134, which is coupled to the cloud environments 528 to obtain templates 132 from the cloud environment 528. In particular, the user interface 134 may be coupled to various pieces of network hardware that is able to access the cloud environment 528 to obtain the cloud-based templates 132 from the cloud-based template store 130. Note that in some embodiments, the controller 502-1 may be able to contact the cloud environment 528 directly, without going through the user interface 134.

In some embodiments, an administrator of the control network 500 may select preconfigured templates from a template store in the cloud-based template store 130. For example, an administrator of the control network 500 may identify the types of devices that are likely to appear on the control network 500, identify templates available from the cloud-based template store 130, and obtain those templates for later application to devices on the control network 500. In other embodiments, the controller 502-1 may be configured to automatically access the cloud environment 528 to attempt to obtain cloud-based templates 132 from the cloud environment 528 when the device 506 is coupled to the controller 502-1.

In some embodiments, the network administrator of the control network 500 may be able to modify templates, either cloud-based templates 132 or local templates 526, to include specific configuration for a particular control network 500. In particular, the network administrator may be able to apply custom naming conventions, custom identification numbers, custom compute characteristics, and so forth.

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 6:
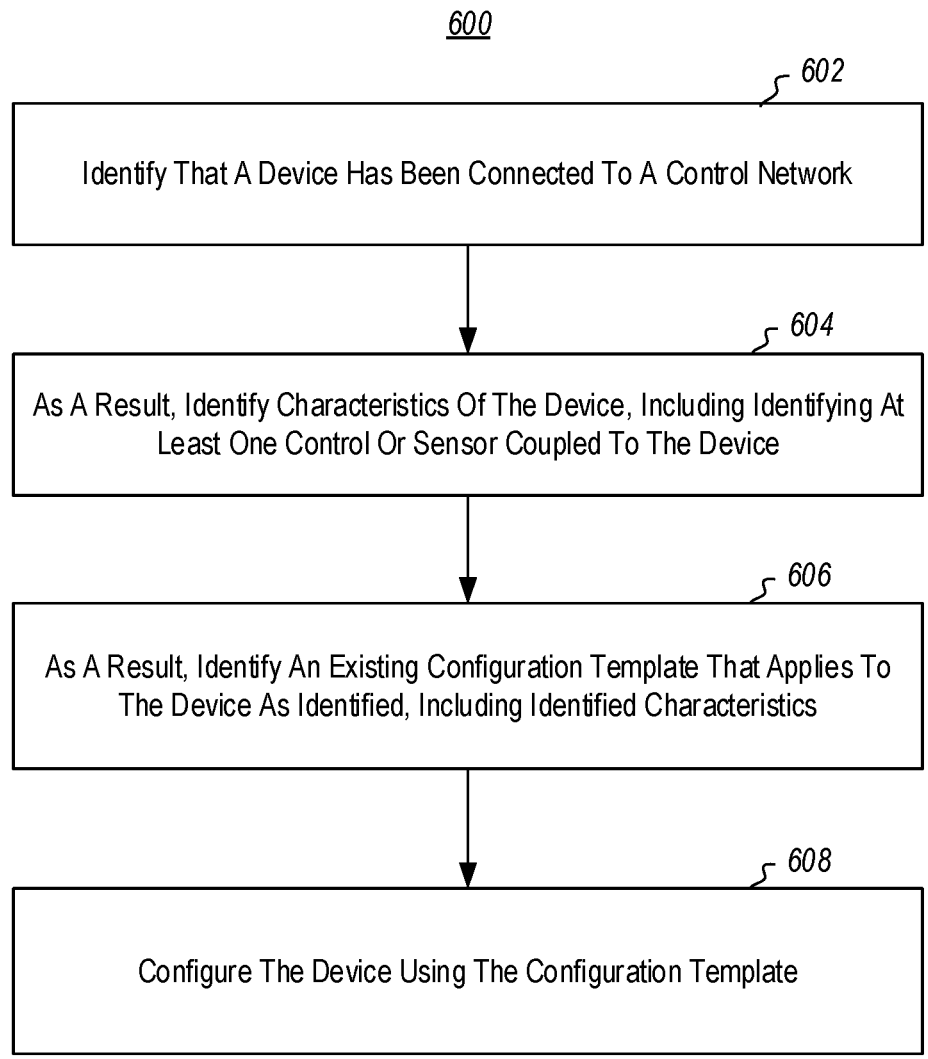
FIG. 6 illustrates a method of efficiently configuring devices.

Referring now to FIG. 6, a method 600 is illustrated. The method 600 may be practiced in an equipment control environment. The method 600 includes actss for configuring a device.

The method 600 includes identifying that a device has been connected to a control network (act 602). For example, the controller 102-1 may be configured to detect that the device 106 has been connected to the controller 102-1.

The method 600 includes, as a result, identifying characteristics of the device, including identifying at least one control or sensor coupled to the device. (act 604). For example, as a result of the device 106 being connected to the controller 102-1, the controller 102-1 may attempt to identify characteristics of the device 106. In some embodiments, the controller 102-1 may attempt to identify one or more controls or sensors coupled to the device 106.

The method 600 includes, as a result, identifying an existing configuration template that applies to the device as identified, including identified characteristics (act 606). For example, as a result of identifying that the device 106 has been connected to the controller 102-1, and as a result of identifying characteristics of the device 106, the controller 102-1 may attempt to identify an appropriate configuration template to apply to the device 106. For example, the controller 102-1 may identify one of the templates 126 included in the template store 124.

The method 600 includes configuring the device using the configuration template (act 608). For example, the controller 102-1 may use an identified template to configure the device 106 by applying the identified template to the device 106. In particular, information from the identified template will be populated in memory storage or mass storage of the device 106 as configuration 110.

The method 600 may be practiced where identifying characteristics of the device comprises identifying a location of the device in the controller network. For example, in some embodiments, the controller 102-1 may identify a location where the device 106 is installed in a hierarchy of controllers and devices. An appropriate template will be selected based on the location of the device 106 in the hierarchy.

The method 600 may be practiced where identifying characteristics of the device comprises capabilities of the device. For example, the method may include identifying actions that the device 106 is capable of performing such as computing actions, communication actions, storage actions, etc.

The method 600 may be practiced where identifying characteristics of the device comprises identifying an amount of processing power of the device. For example, this may include identifying the number of computing operations that can be performed in a particular period of time, the types of computing operations that can be performed by the device, or other such characteristics.

The method 600 may be practiced where identifying characteristics of the device comprises identifying a number of cores on the device.

The method 600 may be practiced where identifying characteristics of the device comprises identifying an amount of accessible memory on the device.

The method 600 may be practiced where identifying characteristics of the device comprises identifying a manufacturer and a model number of the device.

The method 600 may be practiced where identifying characteristics of the device comprises identifying a similarity of a model number of the device to another device.

The method 600 may be practiced where configuring the device using the configuration template comprises automatically configuring compute for the device. For example, embodiments may include automatically loading instructions into the compute 112 of the device 106 to allow the device 106 to perform various computer operations as described previously herein.

The method 600 may be practiced where configuring the device using the configuration template comprises automatically configuring authentication for the device. For example, some embodiments may include providing appropriate tokens or other credentials to allow the device 106 to authenticate to other equipment in the control network 100 to allow the device 106 to access certain resources.

Further, the methods may be practiced by a computer system including one or more processors and computer-readable media such as computer memory. In particular, the computer memory may store computer-executable instructions that when executed by one or more processors cause various functions to be performed, such as the acts recited in the embodiments.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A computer system comprising:
   one or more processors; and
   one or more non-transitory computer-readable media having stored thereon instructions that are executable by the one or more processors to configure the computer system to configure devices, including instructions that are executable to configure the computer system to perform at least the following:
   detecting that a device has been connected to a control network;
   responsive to the detection of the device, identifying characteristics of the device, including identifying at least one sensor coupled to the device;
   based on the identification of the at least one sensor coupled to the device, identifying an existing configuration template from a template store that applies to the device as identified including the identified characteristics, the configuration template being usable to configure the device to interpret data from the at least one sensor; and
   configuring the device using the configuration template.

2. The computer system of claim 1, wherein identifying characteristics of the device comprises identifying a location of the device in the controller network.

3. The computer system of claim 1, wherein identifying characteristics of the device comprises capabilities of the device.

4. The computer system of claim 1, wherein identifying characteristics of the device comprises at least one of:
   an amount of processing power of the device;
   a number of cores on the device; or
   an amount of accessible memory.

5. The computer system of claim 1, wherein identifying characteristics of the device comprises identifying a manufacturer and a model number of the device.

6. The computer system of claim 1, wherein identifying characteristics of the device comprises identifying a similarity of a model number of the device to another device.

7. The computer system of claim 1, wherein configuring the device using the configuration template comprises automatically configuring compute for the device.

8. The computer system of claim 1, wherein configuring the device using the configuration template comprises automatically configuring authentication for the device.

9. In an equipment control environment, a method of configuring a device, the method comprising:
   detecting that a device has been connected to a control network;
   responsive to the detection of the device, identifying characteristics of the device, including identifying at least one sensor coupled to the device;
   based on the identification of the at least one sensor coupled to the device, identifying an existing configuration template from a template store that applies to the device as identified, including the identified characteristics, the configuration template being usable to configure the device to interpret data from the at least one sensor; and
   configuring the device using the configuration template.

10. The method of claim 9, wherein identifying characteristics of the device comprises identifying a location of the device in the controller network.

11. The method of claim 9, wherein identifying characteristics of the device comprises capabilities of the device.

12. The method of claim 9, wherein identifying characteristics of the device comprises at least one of:
   an amount of processing power of the device;
   a number of cores on the device; or
   an amount of accessible memory.

13. The method of claim 9, wherein identifying characteristics of the device comprises identifying a manufacturer and a model number of the device.

14. The method of claim 9, wherein identifying characteristics of the device comprises identifying a similarity of a model number of the device to another device.

15. The method of claim 9, wherein configuring the device using the configuration template comprises automatically configuring compute for the device.

16. The method of claim 9, wherein configuring the device using the configuration template comprises automatically configuring authentication for the device.

17. A computer system comprising:
- a controller comprising one or more connection points for connecting devices to the controller;
- a template store storing one or more configuration templates used for automatically configuring devices connected to the controller;
- wherein the controller is configured to:
- detect that a device has been connected to a control network;
- responsive to the detection of the device, identify characteristics of the device, including identifying at least one sensor coupled to the device;
- based on the identification of the at least one sensor coupled to the device, identify an existing configuration template from the template store that applies to the device as identified, including identified characteristics, the configuration template being usable to configure the device to interpret data from the at least one sensor; and
- configure the device using the configuration template.

18. The computer system of claim 17, wherein identifying characteristics of the device comprises identifying a manufacturer and a model number of the device.

19. The computer system of claim 17, wherein configuring the device using the configuration template comprises automatically configuring compute for the device.

20. The computer system of claim 17, wherein configuring the device using the configuration template comprises automatically configuring compute for the device.

21. The computer system of claim 1, wherein detecting that the device has been connected to the control network further comprises:
- requesting a raw data value from the device, wherein identifying at least one sensor coupled to the device includes using the raw data value received responsive to the request to identify a sensor type of the sensor.

* * * * *